United States Patent
Riedel

(10) Patent No.: US 9,876,034 B2
(45) Date of Patent: Jan. 23, 2018

(54) TRANSISTOR ARRAY ROUTING

(71) Applicant: FLEXENABLE LIMITED, Cambridge (GB)

(72) Inventor: Stephan Riedel, Dresden (DE)

(73) Assignee: FLEXENABLE LIMITED, Cambridge (GB)

( * ) Notice: Subject to any disclaimer, the term of this patent is extended or adjusted under 35 U.S.C. 154(b) by 22 days.

(21) Appl. No.: 15/023,745

(22) PCT Filed: Oct. 7, 2014

(86) PCT No.: PCT/EP2014/071443
§ 371 (c)(1),
(2) Date: Mar. 22, 2016

(87) PCT Pub. No.: WO2015/052187
PCT Pub. Date: Apr. 16, 2015

(65) Prior Publication Data
US 2016/0233237 A1 Aug. 11, 2016

(30) Foreign Application Priority Data
Oct. 8, 2013 (GB) .................................. 1317765.4

(51) Int. Cl.
*H01L 29/417* (2006.01)
*H01L 29/423* (2006.01)
(Continued)

(52) U.S. Cl.
CPC ........ *H01L 27/124* (2013.01); *H01L 27/1248* (2013.01); *H01L 29/41733* (2013.01);
(Continued)

(58) Field of Classification Search
CPC .............. H01L 27/124; H01L 27/1248; H01L 29/41733; H01L 29/42384;
(Continued)

(56) References Cited

U.S. PATENT DOCUMENTS

2003/0030381 A1\* 2/2003 Yamazaki ........... G02F 1/13454
315/169.1
2007/0035532 A1 2/2007 Amundson et al.
2008/0012794 A1\* 1/2008 Battersby .............. G02F 1/1345
345/55
(Continued)

FOREIGN PATENT DOCUMENTS

JP 02-187787 A 7/1990
JP 11-305681 A \* 5/1999
(Continued)

*Primary Examiner* — Marvin Payen
*Assistant Examiner* — Jeremy Joy
(74) *Attorney, Agent, or Firm* — Sughrue Mion, PLLC

(57) ABSTRACT

A device comprising an array of transistors, wherein the device comprises: a first conductor layer at a first level defining a plurality of first conductors providing either source or gate electrodes for said array of transistors; a second conductor layer at a second level defining a plurality of second conductors providing the other of source or gate electrodes for said array of transistors; wherein said second conductor layer further defines routing conductors at one or more locations between said second conductors, each routing conductor connected by one or more interlayer conductive connections to a respective first conductor.

12 Claims, 2 Drawing Sheets

Figure 1:
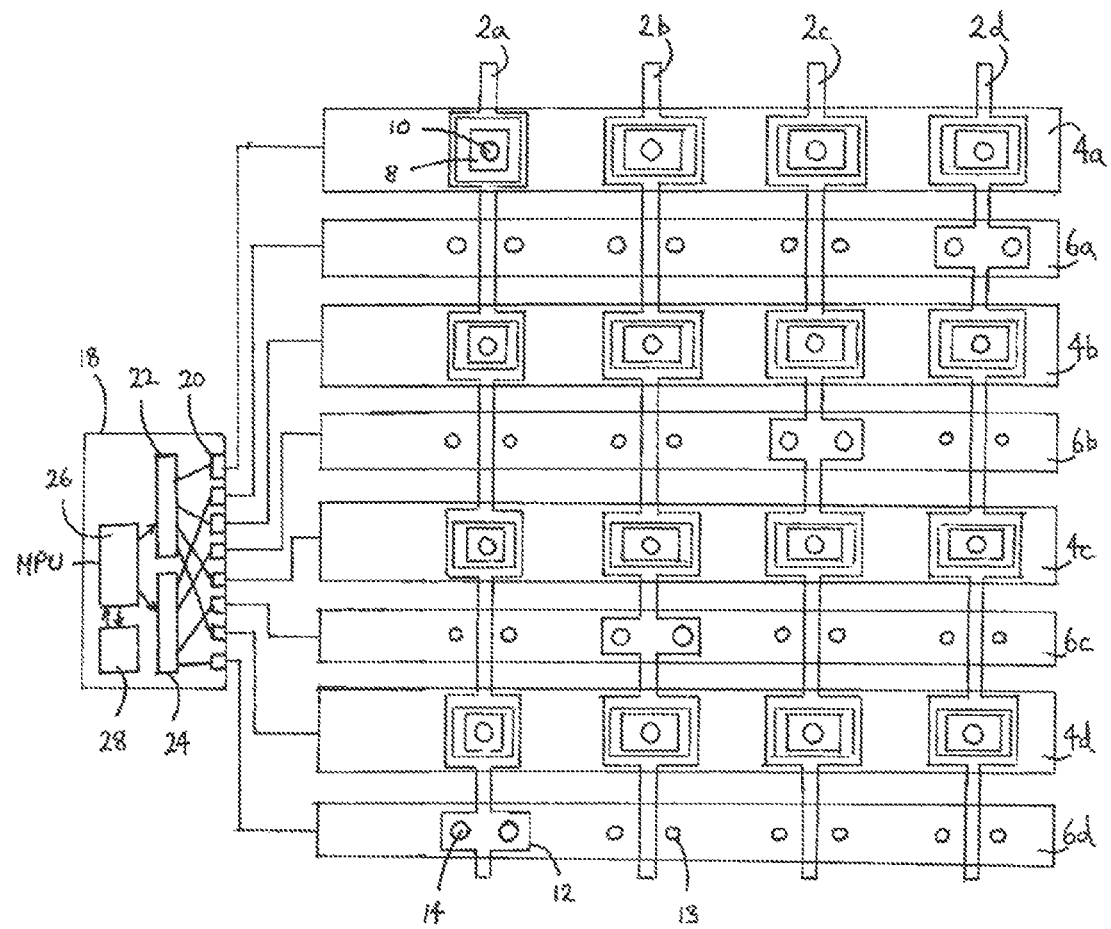

(51) Int. Cl.
  *H01L 27/32* (2006.01)
  *G02F 1/1345* (2006.01)
  *H01L 27/12* (2006.01)
  *G02F 1/1362* (2006.01)
  *G09G 3/36* (2006.01)

(52) U.S. Cl.
  CPC ...... *H01L 29/42384* (2013.01); *G02F 1/1345* (2013.01); *G02F 1/13454* (2013.01); *G02F 1/136286* (2013.01); *G09G 3/3648* (2013.01)

(58) Field of Classification Search
  CPC ......... H01L 29/42394; G02F 1/136286; G02F 2001/13456; G02F 1/1345; G02F 1/13454; G09G 2300/0426; G09G 3/3648
  See application file for complete search history.

(56) References Cited

U.S. PATENT DOCUMENTS

| | | | |
|---|---|---|---|
| 2010/0066957 A1* | 3/2010 | Miyazaki | G02B 5/0231 349/112 |
| 2010/0066967 A1* | 3/2010 | Takahashi | G02F 1/1345 349/143 |
| 2010/0295764 A1* | 11/2010 | Wang | G02F 1/136286 345/92 |
| 2013/0093657 A1 | 4/2013 | Song et al. | |

FOREIGN PATENT DOCUMENTS

| | | |
|---|---|---|
| JP | 11-305681 A | 11/1999 |
| JP | 11305681 A * | 11/1999 |

* cited by examiner

TRANSISTOR ARRAY ROUTING

A transistor array typically comprises an array of source conductors providing the source electrodes for the transistors, an array of drain conductors providing the drain electrodes for the transistors, and an array of gate conductors providing the gate electrodes for the transistors.

One technique for connecting the source and gate conductors to the respective output terminals of one or more driver chips involves terminating the source conductors at one edge of the array and terminating the gate conductors at another edge of the array, and either (a) providing separate source and gate driver chips at respective edges of the array, or providing source and gate driver chips at a common edge of the array and providing conductive tracks extending around two edges of the array to the gate or source conductors terminating at a different edge of the array to where the driver chip is located.

The inventors for the present application have identified the challenge of improving the routing of the source/gate conductors to one or more driver chip(s).

There is hereby provided a device comprising an array of transistors, wherein the device comprises: a first conductor layer at a first level defining a plurality of first conductors providing either source or gate electrodes for said array of transistors; a second conductor layer at a second level defining a plurality of second conductors providing the other of source or gate electrodes for said array of transistors; wherein said second conductor layer further defines routing conductors at one or more locations between said second conductors, each routing conductor connected by one or more interlayer conductive connections to a respective first conductor.

According to one embodiment, the first conductors provide source electrodes for said array of transistors, and the second conductors provide gate electrodes for said array of transistors.

According to one embodiment, each first conductor is associated with a respective one or more columns of said array of transistors, and each second conductor is associated with a respective one or more rows of said array of transistors.

According to one embodiment, the first conductors provide gate electrodes for said array of transistors, and the second conductors provide source electrodes for said array of transistors.

According to one embodiment, said second conductors and said routing conductors terminate at a common side of the array of transistors.

According to one embodiment, the method further comprises a driver chip at said common side of the array of transistors, said driver chip comprising source and gate output terminals, wherein the source and gate output terminals have an order matching the order of the second conductors and routing conductors at said common side of the array of transistors.

According to one embodiment, the first level is below the second level.

According to one embodiment, said interlayer conductive connections form part of a uniform array of interlayer connects also including interlayer connects not connected to any first conductor.

Figure 2:
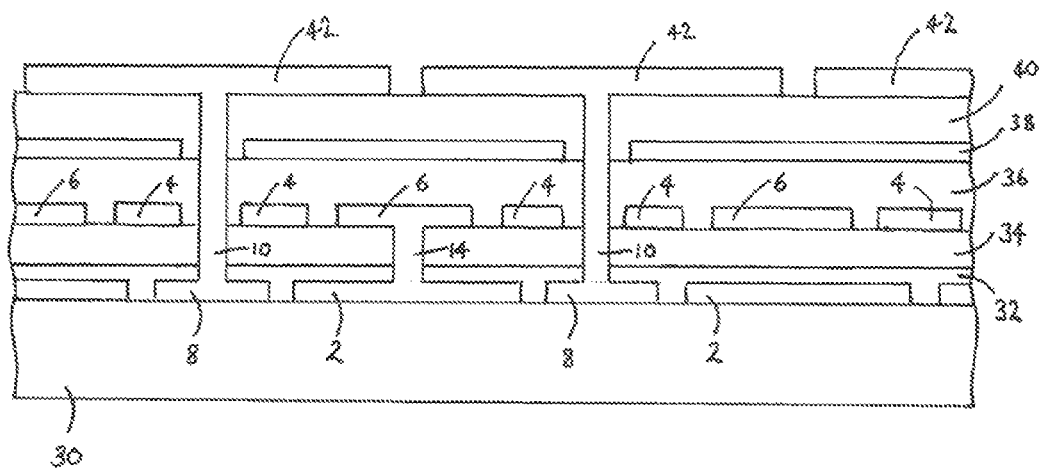

An embodiment of the present invention is described hereunder, by way of non-limiting example only, with reference to the accompanying drawings, in which:

FIG. 1 is a schematic plan view of an example of a configuration for the gate and source conductors of a TFT array; and FIG. 2 is a schematic cross-sectional view of an example of a configuration for the gate and source conductors of a TFT array.

For the sake of simplicity, FIGS. 1 and 2 illustrate an example of a configuration for the gate and source conductors of a small 4×4 array of thin film transistors (TFTs); but the same type of configuration is applicable to much larger transistor arrays such as transistor arrays comprising more than a million transistors. Other examples of ways in which the devices illustrated in the drawings can be modified within the scope of the present invention, are discussed at the end of this description.

A first patterned conductor layer is provided on a supporting substrate 30. The supporting substrate 30 may, for example, comprise a plastic film and a planarisation layer formed between the plastic film and the first conductor layer, and one or more additional, functional layers (e.g. conductor and/or insulator layers) either between the plastic film and the planarisation layer, and/or between the planarisation layer and the first patterned conductor layer, and/or on the opposite side of the plastic film to the planarisation layer.

The first patterned conductor layer is patterned to define (i) an array of source conductors 2, 2a, 2b, 2c, 2d, which, in this example, each provide the source electrodes for a respective column of transistors; and an array of drain conductors 8 which each provide the drain electrode for a respective transistor. This patterning of the first patterned conductor layer may, for example, be achieved by a photolithographic technique.

Over the patterned first conductor layer defining the source and drain conductors 2, 8 is formed a semiconductor layer 32, which provides a respective semiconductor channel for each transistor. The semiconductor layer 32 may, for example, be an organic polymer semiconductor deposited by a liquid processing technique such as spin-coating or flexographic printing.

Over the semiconductor layer 32 is formed a dielectric layer 34, which provides a respective gate dielectric for each transistor. The dielectric layer may, for example, comprise one or more organic polymer dielectric layers.

The semiconductor layer 32 and dielectric layer 34 are then patterned to define one or more through holes extending down to each source conductor 2. This patterning may be performed by, for example, laser ablation. This patterning process may also involve forming redundant through holes in all other corresponding locations even where there is no underlying source conductor 2 (landing pad 12), which redundant through holes 13 are also filled with conductor material (during the deposition of the second conductor layer that forms the gate conductors 4, 4a, 4b, 4c, 4d and routing conductors 6, 6a, 6b, 6c, 6d) to create redundant interlayer connects. These redundant interlayer connects do not connect to any source conductor 2, but the provision thereby of a uniform array of interlayer connects 13, 14 across the whole area of the TFT array can be advantageous from the point of view of providing a display having uniform characteristics across the whole area of the TFT array, in the example that the TFT array is used to control optical media as part of a display device.

The second conductor layer is then patterned to define (i) an array of gate conductors 4 each providing the gate electrodes for a respective row of transistors, and (ii) an array of routing conductors 6 extending parallel to the gate conductors 6 and each located between a respective pair of gate conductors 4. The patterning of the second conductor layer also defines through holes in the gate conductors 4 at locations over the centres of the drain conductors 8. As discussed below, these through holes allow the formation of interlayer conductive connections 10 between the drain conductors 8 and respective top pixel conductors 42. The routing conductors 6 are formed where the second conductor layer defines interlayer conductive connections down to the source conductors 2. Each routing conductor 6 is connected to a respective source conductor by, for example, a respective pair of interlayer conductive connections 14 defined by the second conductor layer. The gate conductors 4 and routing conductors 6 commonly terminate at the same edge of the array of transistors.

The source conductors 2 defined by the first patterned conductor layer are each configured to define a respective landing pad 12 of relatively large width in a direction substantially parallel to the routing conductors 6. These landing pads 12 facilitate the formation of the interlayer conductive connections 14 down to the source conductors 2 from the routing conductors 6.

FIG. 2 is a cross-section of part of the device taken along the centre line of one of the source conductors 2. For the purpose of better explaining the invention, the cross-sectional view of FIG. 2 shows an interlayer conductive connection 14 extending down to a part of the respective source conductor located on the centre line of that source conductor 2.

Over the second patterned conductor layer is formed an insulator layer 36, and over the insulator layer 36 is formed a third conductor layer 38. The third conductor layer 38 is patterned to define a substantially continuous conductor layer punctured by through holes that allow the formation of interlayer conductive connections 10 between the drain conductors 8 through the second and third conductor layers and up to respective top pixel conductors 42. This third conductor layer functions to screen the top pixel conductors 42 from the effects of electric potentials at all underlying conductors, including the gate conductors 4 and routing conductors 6.

Over the third conductor layer is formed a further insulator layer 40. The insulator layers 36, 40 may, for example, be organic polymer insulator layers. The insulator layers 36, 40, dielectric layer 34 and semiconductor layer 32 are then patterned to define through holes extending down to each drain conductor 8 via the through holes defined in the third conductor layer and via the through holes defined in the gate conductors 4. These through holes have a diameter smaller than the through holes defined in the gate conductors 4 and the third conductor layer in order to avoid any electrical shorts between the interlayer conductive connections 10 and the third conductor layer 38 and/or gate conductors 4.

Over the top insulator layer 40 is deposited a conductor material. The conductor material fills the through holes defined in the insulator layers 36, 40, dielectric layer 34 and semiconductor layer 32 and forms a fourth conductor layer 42 over the top insulator layer 40. This fourth conductor layer is then patterned to form an array of pixel conductors 42, each pixel conductor associated with a respective drain conductor 8. The pixel conductors 42 may, for example, be used to control an optical media (not shown) provided above the fourth conductor layer.

Examples of materials for the first, second, third and fourth conductor layers include metals and metal alloys.

A gate/source driver chip 18 is bonded to the substrate 30 at an edge of the transistor array where the gate conductors 4 and routing conductors 6 terminate. Each of the gate and routing conductors is connected to a respective output terminal 20 of the driver chip. In this example, the driver chip 18 is configured such that the order of the output terminals 20 matches the order of the gate and routing conductors 4, 6. This avoids the need for any of the gate and routing conductors 4, 6 to cross each other, and facilitates situating the driver chip 18 closer to the transistor array.

The single chip driver integrated circuit (IC) 18 comprises a gate driver block 22, a source driver block 24, a logic block 26 and a memory block 28. The functions of the logic block 26 include: interfacing between the driver IC 18 and a main processing unit (MPU); transferring data to and from the memory 28; co-ordinating the signals applied by the gate and source driver blocks to the gate and routing (source) conductors 4, 6; and controlling the transfer of output data to the source driver block 24. The driver IC 18 may include other blocks.

The driver chip 18 operates to (i) sequentially switch the rows of transistors between off and on states by applying appropriate voltages to the respective gate conductors 4, and (ii) simultaneously apply respective data voltages to all of the source conductors 2 (via the routing conductors 6) to achieve the desired respective electric potentials at each pixel conductor associated with the row of transistors in the on-state.

In the above-described example, one source routing conductor 6 is provided between a respective pair of gate conductors. Examples of variations include: (a) providing the source routing conductors 6 for more than one source conductor 2/column of transistors between a pair of gate conductors 4, or providing the gate conductors 4 for more than one of row of transistors between a pair of source routing conductors 6. More generally, the ratio of gate conductors 4 to routing conductors 6 can be greater or smaller than 1. According to one specific example, source routing conductors 6 for a respective set of two columns of transistors are provided between each respective pair of gate conductors 4, to enable a TFT array having more columns of transistors than rows of transistors, whilst facilitating the placement of the driver chip(s) for the source conductors and the gate conductors at the same, shorter edge of the TFT array.

Figure 3:
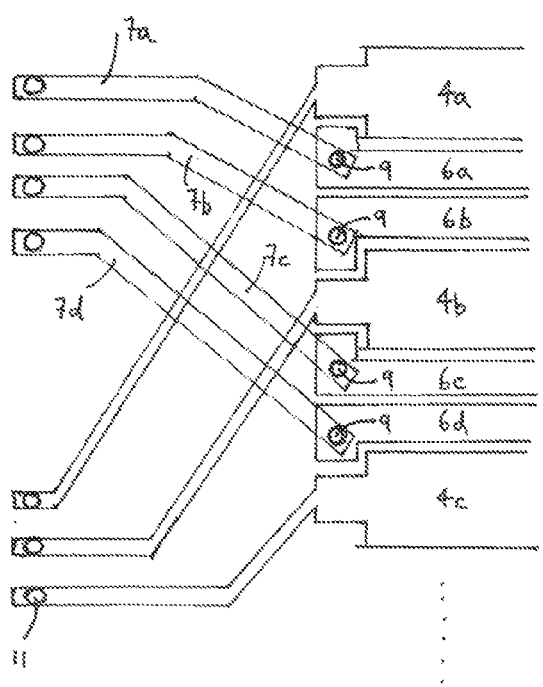

In the above-described example, a single combined gate/source driver chip is used having source and gate output terminals matching the order of the gate and routing conductors at the edge of the TFT array. An example of one variation includes: using one or more driver chips wherein the source output terminals are grouped separately to the gate output terminals. FIG. 3 schematically illustrates one technique for achieving crossover of gate conductors and routing conductors, in such a variation. FIG. 3 relates to the example of routing conductors 6 for a respective set of two source conductors 2/transistor columns between a pair of gate conductors 4, but the same technique is also applicable to any other ratio of source routing conductors 6 (transistor columns) 6 to gate conductors 4 (transistor rows). The first conductor layer defining the source conductors 2 (not shown in FIG. 3) further defines extra conductors 7a, 7b, 7c, 7d leading outwards from the edge of the TFT array, and underlying the later-formed portions of the gate conductors 4 leading outwards from the same edge of the TFT array. 4. The dielectric layer 34, which extends beyond this edge of the TFT array prevents electrical shorting between these extra conductors 7a, 7b, 7c, 7d and the gate conductors 4. The process of forming the through holes for interlayer connects 14 involves forming extra through holes in locations above each extra conductor 7a, 7b, 7c, 7d; and the process of depositing the second conductor layer also fills these extra through holes to create conductive connections 9 between each routing conductor 6 and a respective extra conductor 7a, 7b, 7c, 7d. Reference numeral 11 in FIG. 3 designates further interlayer conductive connections that connect each of the extra conductors 7a, 7b, 7c, 7d and gate conductors 6 to a level at which the one or more driver chips are located.

The description above relates to the example of an array of top-gate transistors. The same kind of technique is equally applicable to arrays of bottom-gate transistors, in which case the deposition order of the first patterned conductor layer, semiconductor layer 32, dielectric layer 34 and second patterned conductor layer would be reversed, and no through holes would need to be defined in the gate conductors 4.

The above description relates to the example of an annular semiconductor channel design in which the drain electrode for each transistor is encompassed within the source-drain conductor layer by the source electrode for that transistor. The above-described technique is equally applicable to other semiconductor channel designs, including non-annular semiconductor channel designs and other kinds of annular semiconductor channel designs. For example, the source and drain electrodes for each transistor may comprise interdigitated finger structures.

The above-description relates to the example of providing a single driver chip for both the gate and source conductors, but the above-described technique is also applicable to, for example, devices in which separate driver chips are provided for the driving the source and gate conductors.

The above-description relates to the example of providing source routing conductors 6 between gate conductors 4 at the same level as the gate conductors; but another example involves providing gate routing conductors between source conductors at the same level as the source conductors, and providing one or more interlayer conductive connections between each gate routing conductor and the respective gate conductor.

The above-described technique avoids the need for either (a) having separate source and gate driver chips at different edges of the transistor array, or (b) routing the source conductors or gate conductors along two edges of the transistor array; and thereby facilitates a reduction in the substrate area required outside of the transistor array. Also, for the example of using a combined source/drive chip whose source and gate output terminals have an order matching the order of the source and gate conductors at the edge of the TFT array, there is the additional advantage that all of the conductors outside of the transistor array can be defined at one level (i.e. in one single conductor layer).

In addition to the modifications explicitly mentioned above, it will be evident to a person skilled in the art that various other modifications of the described embodiment may be made within the scope of the invention.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features.

The invention claimed is:

1. A device comprising an array of transistors, wherein the device comprises:
   a first conductor layer at a first level defining a plurality of first conductors providing either source or gate electrodes for said array of transistors;
   a second conductor layer at a second level defining a plurality of second conductors providing the other of source or gate electrodes for said array of transistors;
   wherein said second conductor layer further defines routing conductors at one or more locations between said second conductors, each routing conductor connected by one or more interlayer conductive connections to a respective first conductor; and
   wherein said interlayer conductive connections form part of a uniform array of interlayer conductors, and said uniform array of interlayer conductors additionally include interlayer conductors which do not provide conductive connections between said routing conductors and said first conductors.

2. The device according to claim 1, wherein the first conductors provide source electrodes for said array of transistors, and the second conductors provide gate electrodes for said array of transistors.

3. The device according to claim 2, wherein each first conductor is associated with a respective one or more columns of said array of transistors, and each second conductor is associated with a respective one or more rows of said array of transistors.

4. The device according to claim 1, wherein the first conductors provide gate electrodes for said array of transistors, and the second conductors provide source electrodes for said array of transistors.

5. The device according to claim 1, wherein said second conductors and said routing conductors terminate at a common side of the array of transistors.

6. The device according to claim 5, further comprising a driver chip at said common side of the array of transistors, said driver chip comprising source and gate output terminals, wherein the source and gate output terminals have an order matching the order of the second conductors and routing conductors at said common side of the array of transistors.

7. The device according to claim 1, wherein the first level is below the second level.

8. The device according to claim 1, wherein said interlayer conductive connections form part of a uniform array of interlayer conductors, and said uniform array of interlayer conductors additionally include interlayer conductors from the routing conductors to locations at said first level where there is no said first conductor.

9. The device according to claim 1, wherein said interlayer conductors extend through one or more layers comprising a semiconductor layer providing semiconductor channels for the array of transistors, and a dielectric layer providing a gate dielectric for the array of transistors.

10. The device according to claim 1, wherein both the interlayer conductors that form said interlayer conductive connections and the interlayer conductors which do not provide conductive connections between said routing conductors and said first conductors, are formed from the same conductor material.

11. A device comprising an array of transistors, wherein the device comprises: a first conductor layer at a first level defining a plurality of first conductors providing either source or gate electrodes for said array of transistors; a second conductor layer at a second level defining a plurality of second conductors providing the other of source or gate electrodes for said array of transistors; wherein said second conductor layer further defines routing conductors at one or more locations between said second conductors, each routing conductor connected by one or more first interlayer conductive connections to a respective first conductor, wherein either said second conductors or said routing conductors crossover the other of said second conductors and said routing conductors at different levels in a region outwards of an edge of the array of transistors, wherein either said second conductors or said routing conductors are routed from said second level to another level by second interlayer conductive connections at said edge of the array of transistors.

12. The device according to claim 11, wherein said another level is said first level.

* * * * *